United States Patent [19]

Dozier

[11] Patent Number: 5,428,188
[45] Date of Patent: Jun. 27, 1995

[54] LOW-COST PACKAGE FOR ELECTRONIC COMPONENTS

[75] Inventor: Hilliard S. Dozier, Morrow, Ohio

[73] Assignee: U.S. Terminals, Inc., Cincinnati, Ohio

[21] Appl. No.: 183,985

[22] Filed: Jan. 18, 1994

Related U.S. Application Data

[63] Continuation-in-part of Ser. No. 959,052, Oct. 9, 1992, abandoned.

[51] Int. Cl.6 .............................. H01L 23/28
[52] U.S. Cl. ........................ 174/52.2; 257/676; 257/687; 257/692; 257/787; 361/728
[58] Field of Search ............... 174/52.2, 52.4; 257/671–672, 676, 687, 692, 694, 787; 361/728, 730, 733

[56] References Cited

U.S. PATENT DOCUMENTS 3,634,600  6/1972  Griffin .
3,767,979  10/1973  Reber et al. .
3,784,884  1/1974  Zoroglu .
3,936,864  2/1976  Benjamin .
4,150,393  4/1979  Wilson et al. .

OTHER PUBLICATIONS

Preliminary Technical Bulletin 3-2-13, Dielectric Materials, Emerson & Cuming, Canton, Mass. 02021 (No date provided).
Ryton ® R-4... Polyphenylene Sulfide, Phillips Chemical Company, pp. 2–3, Sep., 1978.

*Primary Examiner*—Bot L. Ledynh
*Attorney, Agent, or Firm*—Dinsmore & Shohl

[57] ABSTRACT

A low cost package uses non-ceramic materials to environmentally seal an air chamber for an electronic component. The package includes a base formed by a plurality of essentially flat terminals molded in a polyphenylene sulfide resin so as to provide a planar surface for surface mounting to a circuit board. A component placement area on the base receives a cap which covers and seals the area from contaminants.

28 Claims, 5 Drawing Sheets

LOW-COST PACKAGE FOR ELECTRONIC COMPONENTS

RELATED APPLICATION

This is a continuation-in-part of U.S. patent application Ser. No. 07/959,052, filed Oct. 9, 1992 now abandoned.

TECHNICAL FIELD

The present invention relates generally to environmentally sealed packages for electronic components and the like and is particularly directed to a low cost electronic component package having an enclosed air chamber for housing an electronic component. The package utilizes a plastic material to form as the insulating medium, while providing the advantages afforded by the substantially higher cost transistor packages utilizing alumina ($Al_2O_3$) or beryllia (BeO) insulating medium. The invention will be specifically disclosed in connection with a package consisting of high heat tolerant plastic and metal and having a substantially planar surface adapted to be surfaced mounted and electrically connected to a printed circuit board.

BACKGROUND OF THE INVENTION

Electronic component packages capable of environmentally sealing a transistor or other electronic element in an enclosed air chamber are well known in the prior art. These packages typically use alumina ($Al_2O_3$) or beryllia (BeO) as the insulating medium and a copper alloy as the conductor terminals. Typical construction consists of an alumina or beryllia body to which copper terminals are affixed by adhesive or other bonding means, with the electronic components being attached to the conductor terminals by gold bonding wires. A cap member is placed over and cemented to the ceramic body and terminal assembly, thus providing an environmentally sealed space in which the electronic element can function optimally. Such packages advantageously have the capability to withstand the high temperatures involved in automated circuit board preparation and soldering operations, as well as the ability to tolerate long term exposure to atmospheric pressure changes, temperature variations and humidity fluctuations.

However, one significant disadvantage of using alumina or beryllia, is that both of these materials are very expensive to process and manufacture to the desired form. Additionally, precise patterns are required in achieving a connection between the electronic components and the printed circuit boards, which connection must pass either around or through the ceramic substrate. By solving the problem of the connection in this way, the path length and hence, parasitic capacitance and inductance is increased. Yet another problem in prior art ceramic transistor packages, is the difficulty involved in precisely fabricating ceramic structures of small size, which precision is critical in making the package environmentally sealed. For all the above reasons, the cost and complexity of the prior art ceramic packages is very high, i.e., these packages suffer from what can be termed an economic manufacturability problem. See e.g., U.S. Pat. No. 3,784,884 to Zorogluu, and U.S. Pat. No. 3,936,864 to Benjamin.

The realization of the need for a lower cost, easier to manufacture packages for electronic components was felt as early as 1972 as demonstrated by the above-mentioned two patents. In this regard, a very low cost packaging method has been in wide use and consists of encapsulating an entire electronic component and bonding wire/terminal connections in an insulating plastic such as epoxy. This method, although inexpensive, is not suited for applications which required higher frequencies or lower signal loss.

Thus, it can be seen that while each of the prior art devices offer some advantages, they are outweighed by the various disadvantages discussed above.

SUMMARY OF THE INVENTION

Accordingly, it is a primary object of the present invention to provide an improved low cost air environment package for holding and environmentally protecting electronic components, and electrically connecting these components to outside circuitry.

It is also an object of the present invention to provide a package for an electronic component formed from materials that can be processed and manufactured substantially more economically than materials such as alumina or beryllia without losing the advantages offered from these latter named materials.

It is a further object of the present invention to provide a low cost environmentally sealed package for an electronic component using non-ceramic material that is capable of withstanding not only the temperatures and vapors of automated circuit board preparation and soldering operations, but also long term exposure to atmospheric pressure changes, temperature variations, and humidity fluctuations.

Yet another object of the present invention is to provide a low cost package for an electronic component which does not allow the penetration of contaminants such as solvents or vapors into the interior air chamber of the package.

Still another object of the present invention is to provide a low cost environmentally sealed package for a high performance, high frequency electronic component that produces minimal amounts of electrical noise.

A still further object of the invention is to provide a low cost environmentally sealed package for an electronic component that minimizes the length of the circuit path from the component to a circuit board.

It is yet another object of the invention to provide a low cost environmentally sealed package for an electronic component that is optimally designed for surface mounting to a printed circuit board.

A still further object of the invention is to provide a hermetic air chamber for housing an electronic component.

Another object of the invention is to provide a electronic component package that has the shortest possible distance between the electronic component and the terminal.

It is another object of the invention to provide a plastic air chamber for an electronic component with enhanced strength and dimensional stability.

Additional objects, advantages and other novel features of the invention will be set forth in part in the description that follows and, in part, will become apparent to those skilled in the art upon examination of the invention. The objects and advantages of the invention may be realized and obtained by means of the instrumentalities and combinations particularly pointed out in the appended claims.

To achieve the foregoing and other objects and in accordance with the purposes of the present invention as described above, a package is provided for environmentally sealing an electronic component. The package includes a base member having a plurality of electrical terminals arranged in fixed predetermined spaced relationship to each other. Each of the terminals have a bottom surface that is substantially coplanar with the respective top and bottom surfaces of the other of the plurality of terminals. The base member further includes plastic insulating material molded to each of said terminals and encasing the flanges. The bottom surface of the plastic material is coplanar with the bottom surfaces of the terminals. The top surface of the plastic material defines a component placement area. The bottom surface of the plastic material is coplanar with the bottom surfaces of the terminals so that the bottom surface of the base member is substantially coplanar, thereby adapting the base member for surface mounting to a circuit board. The package further includes a cap that is sealable upon the top surface of the plastic material to sealing enclose the component placement area surrounded by the raised rib.

According to one important aspect of the invention, the plastic material used to insulate and secure the terminals is polyphenylene sulfide.

In accordance with another aspect of the invention, the terminals are essentially flat in that they have a thickness that is substantially less than either of their length or width. According to a preferred from of the invention, the top surfaces of the terminals also are substantially coplanar with each other.

In one preferred form of the invention, the flanges, which may be formed by coining selected peripheral areas of the terminals, have a thickness of approximately one third the thickness of the terminals. The flanges also preferably include ears that protrude outwardly into the plastic material for inhibiting withdrawal of the terminals from the molded plastic material.

In another embodiment of the invention, the peripheral areas of the terminals are coined only on their bottom sides to enhance the strength of the package and increase the area of the top surface that is available for mounting an electronic component. According to another aspect of the invention, the top surface of the terminals are over molded with the plastic material and completely covered with plastic material, except for selected predefined recessed bonding areas in which the terminals are exposed for mounting the electronic component(s) and the connections between the terminals and the electronic component(s).

In accordance with another aspect of the invention, the cap is secured to the base member with an adhesive, preferably a two-part epoxy adhesive consisting of approximately three parts by weight of an epoxy polymer to two parts by weight of an anhydride.

According to another aspect of the invention, the peripheral edges of selected portions of the terminals are coined from their bottom sides so that the top portions of these selected edge portions extend outwardly beyond the extension of the corresponding bottom surfaces of these selected edge portions. Plastic material preferably is disposed in the space oriented by the coining, and the bottom surface of the package is coplanar with the bottom surface of the plastic material being coplanar with the non-coined portions of the terminals.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different obvious aspects all without departing from the invention. Accordingly, the drawing and description will be regarded as illustrative in nature and not as restrictive.

BRIEF DESCRIPTION OF THE DRAWINGS

The accompanying drawings incorporated in and forming a part of the specification, illustrates several aspects of the present invention, and together with the description serve to explain the principles of the invention. In the drawings.

Reference will now be made in detail to the present preferred embodiment of the invention, an example of which is illustrated in the accompanying drawings, wherein like numerals indicate the same elements throughout the views.

DETAILED DESCRIPTION OF THE PREFERRED EMBODIMENT

Figure 1:
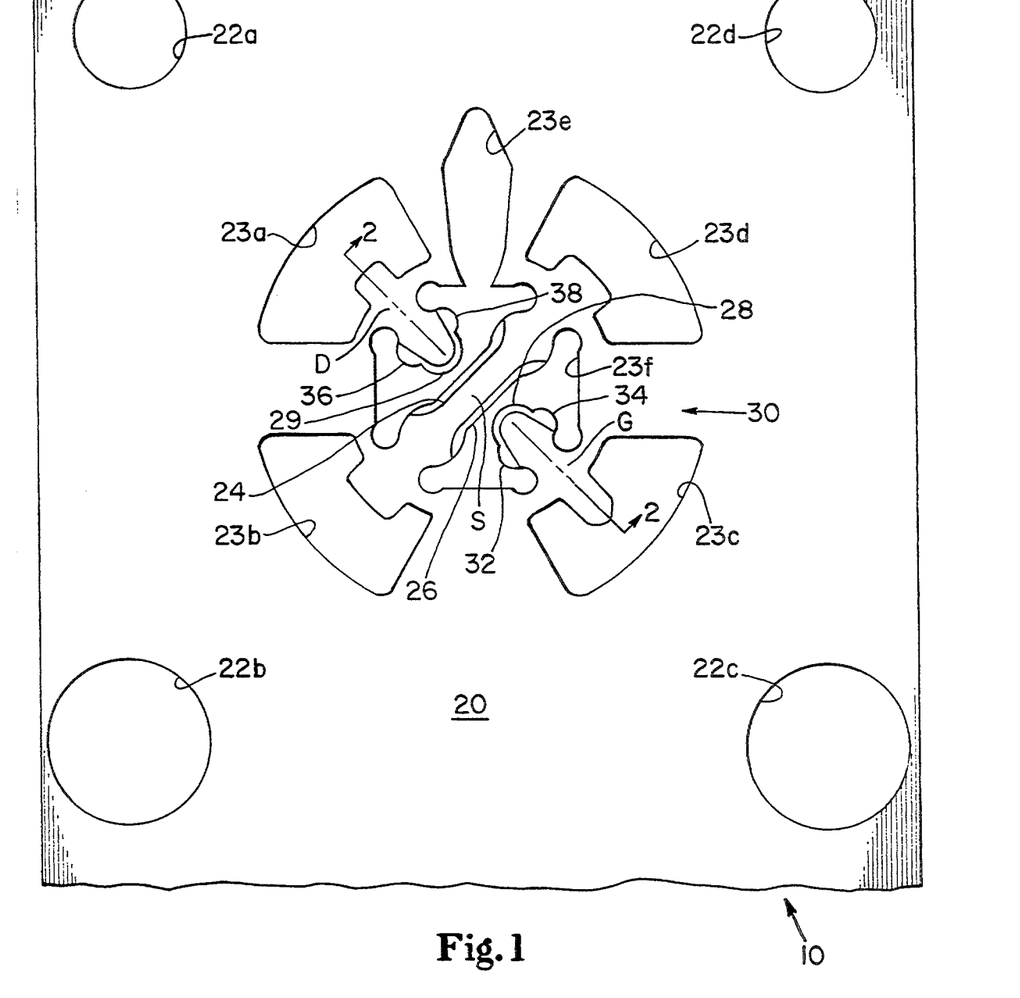
FIG. 1 is a fragmentary plan view of a manufacturing strip containing a lead frame used to support the terminals of a base member of the preferred embodiment of the present invention during the manufacturing process.

Referring now to the drawings, FIG. 1 shows a manufacturing strip, generally designated by the numeral 10 in the drawings. In the preferred embodiments of the invention, the manufacturing strip has a thickness of 0.008" to 0.0015" and is formed of either a copper alloy, such as copper alloy No. C-194, or a beryllium copper alloy. The manufacturing strip is formed by a plurality of serially connected lead frames, only one of which lead frames 20 is shown in FIG. 1. Each of the lead frames 20 is defined by and spans the distance between four pilot locating holes 22a–22d, which pilot locating holes 22 are used to facilitate placement of the lead frame 20 during the manufacturing process. The lead frame 20 functions to support a base member 30 (not all of which is shown in FIG. 1) during the manufacturing process.

The lead frame 20 of the illustrated embodiment is shown as an essentially square electronic component package. However, as those skilled in the art will readily appreciate, a circular package could also readily be made if the lead frame 20 is cut accordingly.

The base member 30 of the illustrated embodiment is specifically designed for use with a field effect transistor, and accordingly includes three electrical terminals, a source terminal S, a gate terminal G, and a drain terminal D. However, as will be appreciated by those skilled in the art, the package of the invention can be adapted for other electronic components by modifying the number and configuration of the terminals as appropriate.

The terminals S, G and D are partially defined in FIG. 1 by six (6) apertures 23a–23f disposed in the central portion of the lead frame 20. The terminals S, G and D are formed from the same manufacturing strip 10 in the preferred manufacturing process for the invention. As a consequence, the top and bottom surfaces of each of the terminals is substantially planar, and the respective top and bottom surfaces of the three terminals are substantially coplanar with each other, as most clearly depicted in FIG. 2. As shown in FIG. 1, the terminals S, G and D are integral with the lead frame 20 in the initial stages of the manufacturing process. Moreover, these terminals S, G and D are also formed of the same copper or beryllium copper alloy as the lead frame 20.

Figure 2:
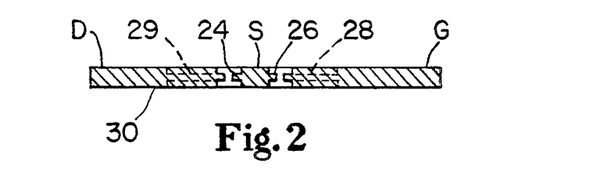
FIG. 2 is a sectional view taken along the line 2—2 in FIG. 1 through the base member and illustrating the top and bottom surfaces of the base member and flanges that are coined on the peripheral edges of the terminals.

In accordance with one aspect of the invention, the terminals S, G and D are provided with flanges extending outwardly from their peripheries. These may be achieved by coining selected peripheral portions of each of the terminals S, G and D from both sides of the lead frame 20. The peripheral portions of the terminals that are coined are optimally those portions subjacent to the component placement area. Positioning the flanges in this area increases the length of any potential material interface path and prevents vapors etc. from entering the air chamber formed in the component placement area. In one of the preferred embodiments, and as best illustrated in FIG. 2, each of the flanges have a thickness that is approximately one-third the thickness of the remaining portions of the terminals. Furthermore, the flanges are preferably positioned approximately half way between the upper and lower terminal surfaces.

As shown in the drawings, source terminal S has flanges 24 and 26 extending outwardly from each of its longitudinal sides, while gate terminal G and drain terminal D have flanges 28 and 29 respectively extending axially (about their longitudinal axes) inwardly from their peripheral ends. Additionally, the flanges 28 and 29 of the gate and drain terminals have outwardly extending ears, that is portions of the flange that protrude substantially further outwardly than do adjacent portions of the flange. Ears 32 and 34 can be seen extending from the adjacent portions of the flange 28 on terminal G, while ears 36 and 38 can be seen extending from terminal D in FIG. 1.

The base member 30 also includes plastic insulating material (not shown in FIG. 1, see FIG. 3) which is molded about the terminals S, G and D in situ, while the terminals are held in place by the lead frame 20. Inasmuch as the package of the preferred embodiment may be subjected to processing temperatures up to 500 degrees F during gold wire bonding and soldering operations, it is critical that any plastic material selected for this purpose have properties that enable it to withstand such extreme temperatures without heat distortion or loss of dimensional stability. The preferred plastic material for molding the base member is a polyphenylene sulfide resin containing 40% glass fiber. Polyphenylene sulfide in this form is sold commercially by Phillips Chemical Company of Bartlesville, Okla. under the trademark RYTON R-4. Polyphenylene sulfide is the preferred plastic insulating material of this invention because it has very good dielectric properties, a heat distortion temperature above 500° F., excellent dimensional stability, excellent resistance to almost all chemicals and superior strength. Polyphenylene sulfide has a melt temperature of 540° and is processed at about 650° F. It also has a very small elongation of approximately 1 and ½ % which makes for a very rigid part.

Figure 3:
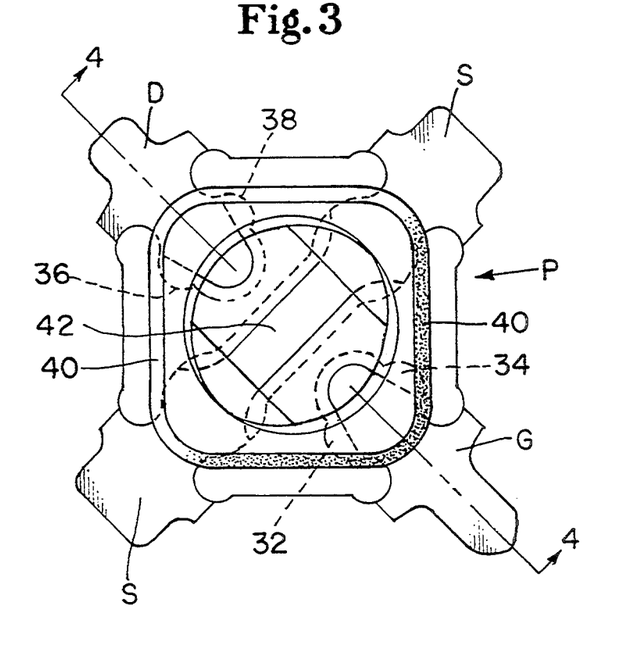
FIG. 3 is a plan view of the base member of FIG. 1 after it has been molded with plastic insulating material and cut from the lead frame.
Figure 4:
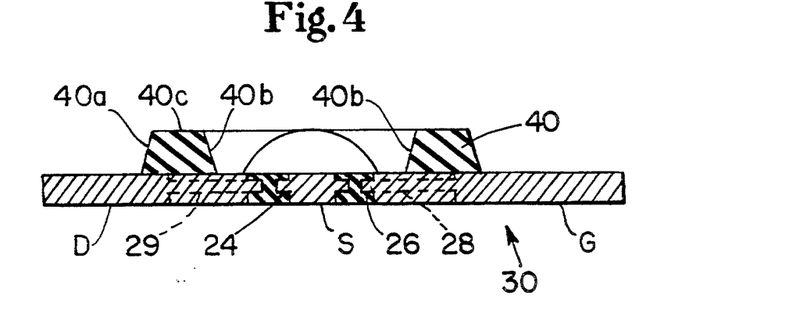
FIG. 4 is a sectional view of the base member of FIG. 3 taken along the line 4—4 illustrating the planar lower surface of the package and the raised plastic molding on the upper surface.
Figure 5:
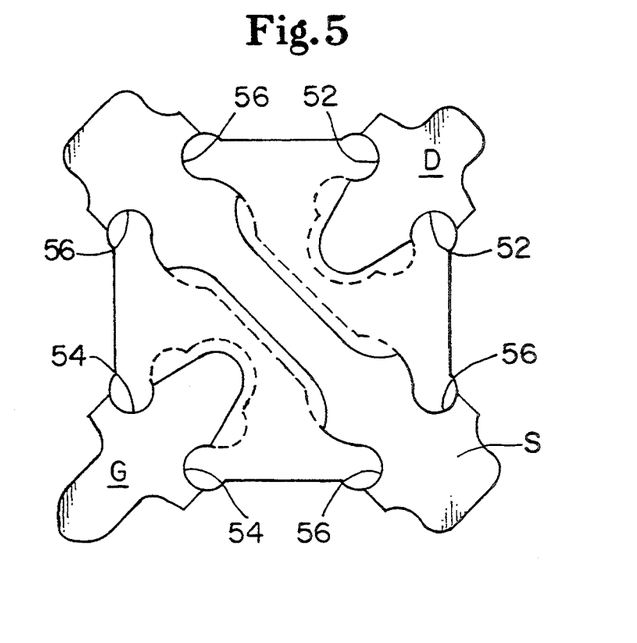
FIG. 5 is a bottom view of the base member of FIG. 4 illustrating terminals secured in fixed relationship with plastic insulating material.

Referring collectively now to the plan view of FIG. 3, the elevational view of FIG. 4, and the bottom view of FIG. 5, the complete base member 30, including the terminals S, G and D and the plastic insulating material molded to the terminals is illustrated. For clarity of illustration, the terminals S, G and D are shown separated from the lead frame 20 in these drawings. However, it will be appreciated that in actual manufacturing practice, the terminals S, G and D may not be separated from the lead frame 20 until after the electronic component is mounted in the package and a cap member is secured to the base member.

FIG. 4 shows that the molded plastic material, generally referenced in the drawings by the letter P, is coplanar with the bottom surfaces of the terminals S, G and D after molding. This insures that the terminals are exposed on the bottom surfaces, and provides the base member with a planar bottom suitable for surface mounting to a circuit board. Further, it will be seen that the molded plastic material P encases all of the flanges 24,26,28 and 29, and completely covering both sides of the protruding flanges 24,26,28 and 29 to securely hold the terminals S, G and D in their fixed predetermined spaced relationship. Further, the ears 32 and 34 on terminal G and ears 36 and 38 on terminal D protrude into the plastic material P to better secure the terminals and to prevent axial withdrawal of the respective terminals G and D.

It will also be seen from FIGS. 3 and 4 that the top surface of the molded plastic material P includes a raised rib 40. The raised rib 40 surrounds a component placement area 42 on the top surface of the base member 30, which component placement area 42 has a surface exposure to each of the three terminals S, G and D. In addition to defining the component placement area 42, the beam type structure of the raised rib 42 functions to facilitate location of a cap member and to enhance the strength of the base member 30.

The raised rib 40 has an angled out wall 40a that slants inwardly as it extends from the bottom to the top of the rib 40 with the angle of the slant being substantially constant about the entire rib 40. As viewed from the plan view of FIG. 3, the outer wall 40 has a square configuration. The inner wall 40b of the raised rib is also angled; however, the inner wall 40b slants outwardly, and, as is apparent from FIG. 3, the angle is not constant. The top surface 40c of the raised rib 40 is substantially planar, and lies in a plane substantially parallel to the respective top and bottom surface planes of the terminals.

Each of the terminals G and D, and both axial ends of the terminal S also have a pair of arcuate cut-outs. These pairs of arcuate cut-outs are designated by the numerals 52 on the terminal D, 54 on the terminal G, and 56 on the terminal S. The bottom view of the base member 30 in FIG. 5 shows that the molded plastic material P flows into these cut-outs 52,54,56 when it is injected into the openings 23e and 23f on opposite sides of the terminal S between that terminal S and the respective terminals G and D. The plastic material P that flows into these terminal cut-outs 52,54,56 functions in a manner analogous to the flange ears 32,34,36 and 38 described above, and prevents the terminals S, G and D from pulling out of the plastic material P after molding. The arcuate cut-outs are also advantageously located so that completed electronic packages can be "cleanly" removed from the lead frame 20. More specifically, it is contemplated that a final manufacturing step for the completed electronic component package will be a "die-out", in which the package is separated from the lead frame 20 in a die. The die separates the package along lateral edges of the terminals S. G and D. With the chosen location of the cut-outs 52,54,56, the separation line of the die terminates in the plastic material P that has flowed into the cut-outs during molding, as best seen from FIG. 6. By terminating the separation line in the plastic, avoiding unwanted residual metal portions of the terminals after "die-out" is facilitated.

As those skilled in the art will immediately appreciate, the component placement area 42 defined by raised rib 40 is intended to house an electronic component, such as a field effect transistor for which the specifically illustrated embodiment is designed. In a typical use of the package, the field effect transistor is positioned in the component placement area 42, and gold wire leads from the transistor are gold bonded to the appropriate terminals S, G and D, which terminals have a surface exposure in the component placement area 42. In order to facilitate this gold bonding, the portions of the terminals S, G and D that are exposed in the component placement area 42 are preferably gold plated. Furthermore, for economy of manufacturing, the exposed portions of the bottom surfaces of the terminals may be tin plated to facilitate soldering of the package to a printed circuit board. One way in which such plating can be achieved is by localized gold plating on the top surface of the lead frame 20 in the vicinity of the terminals, masking the gold plate area, tin plating the entire manufacturing strip 10, and thereafter removing the masking from the gold plating. Other methods of plating the terminals may be preferable, depending upon the particular application for which the package is used, and the manufacturing processed employed for example, it may be preferable to selectively gold plate only the portion of the lead frame that eventually becomes the finished package, providing heavier gold plating on the internal portion of the package with relatively thinner gold plating on the external portions. As a further alterative, it may be preferable to selectively gold plate the internal portion of the package, and to dip the entire package into solder after the cap has been sealed and the package is separated from the lead frame.

Figure 6:
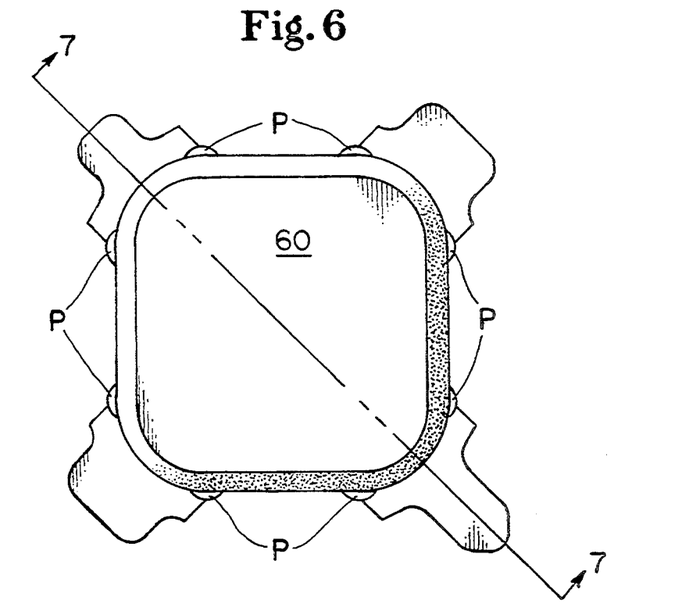
FIG. 6 is a plan view of the base member similar to the illustration of FIG. 3, but showing the base member after a cap member is secured thereto.
Figure 7:
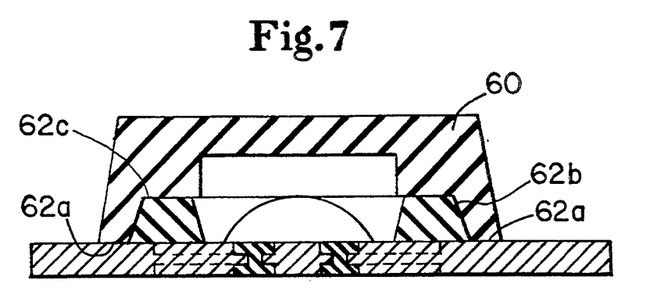
FIG. 7 is a sectional view taken along the line 7—7 in FIG. 6 and illustrating the sealed internal space formed by the package for environmentally protecting an electronic component.

As shown in FIGS. 6 and 7, the component placement area 42 is sealed from the environment by a cap member 60. The cap member 60 has a generally square configuration (when viewed from the top), and has a lower seating surface that is complementary to the configuration of the seating surface of the base member 30. Specifically, the cap member 60 has a lower planar seating surface 62a that seats against the upper surfaces of the molded plastic material P and the terminals S, G and D, which upper surfaces are coplanar in the preferred embodiment. The cap member 60 also has an interior side wall 62b which is sized and angled in correspondency with the outer wall 40a of the raised rib 40 so as to allow the wall 62b to fully engage the outer rib wall 40a. The angled interior side wall 62b leads to a further sealing surface 62c that is matched to the top surface 40c of the raised rib. An adhesive is applied to the mating sealing surfaces between the cap member 60 and the base member 30 to secure the two components together. Preferably, this adhesive is a two-part epoxy adhesive consisting of, in terms of weight ration, approximately twelve parts by weight of an epoxy polymer to eight parts by weight of mica to five parts by weight of an anhydride. One such suitable adhesive is sold commercially under the trademark ECCOBOND 104 from Emerson & Cuming division of W. R. Grace & Co. of Canton, Mass.

Figure 8:
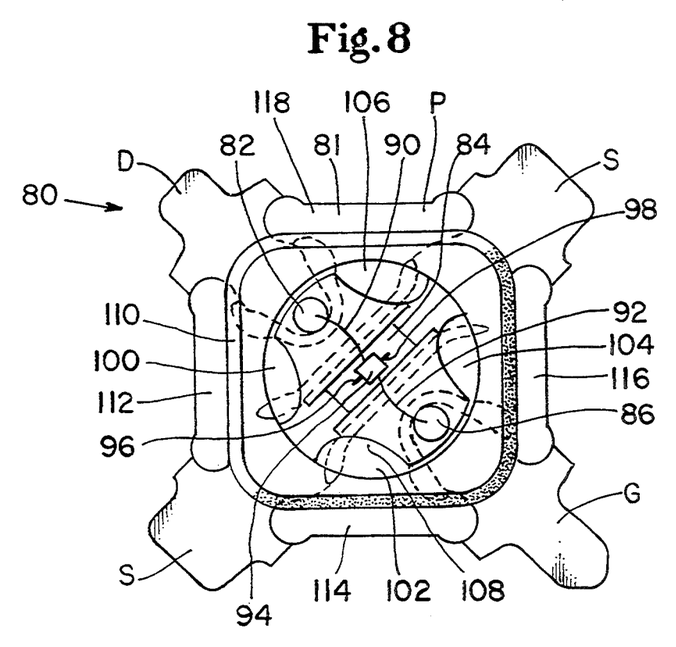
FIG. 8 is a plan view of the base member of an alternate embodiment of the invention that is designed to provide a hermetically sealed chamber for an electronic component.
Figure 9:
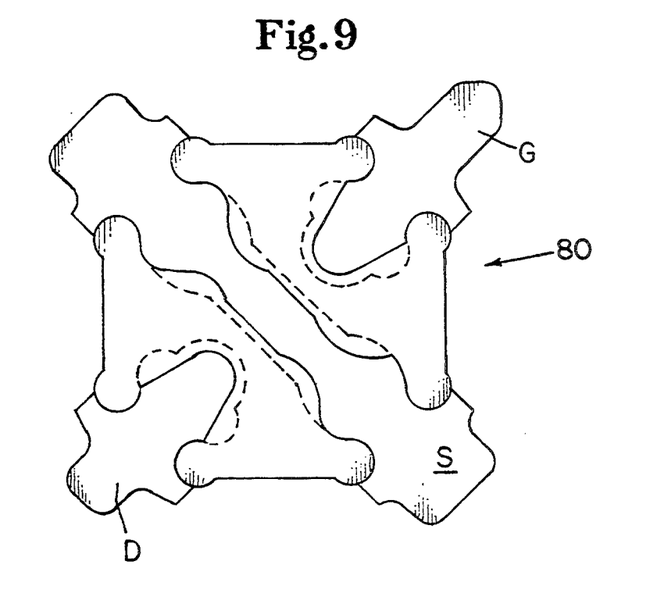
FIG. 9 is a bottom view of the base member of FIG. 9.
Figure 10:
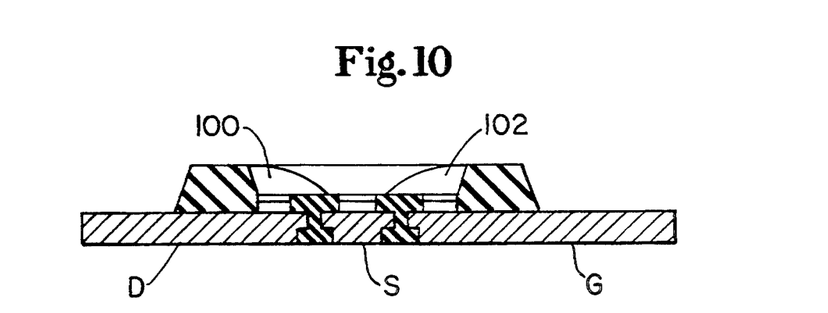
FIG. 10 is an elevational view, partially in cross-section, of the embodiment of FIG. 8.

A further embodiment of the invention is illustrated in FIGS. 8-10, which Figures depict an electronic component package 80, including a base member 81 after it has been molded with plastic material P and cut from its lead frame. Like the embodiment of FIGS. 1-7, the embodiment of FIGS. 8-10 includes three terminals S, G, and D that are arranged in fixed predetermined relationship to each other. These terminals are encased in plastic insulating material P.

While the embodiment of FIGS. 8-10 is similar to the embodiment of FIGS. 1-7 in most respects, it differs in several significant respects. One such difference is in the peripheral coining of the terminals S, G, and D. As best seen in the cross-sectional view of FIG. 10, the coining of the peripheral edges of the terminals in this embodiment is performed from only the bottom side of the lead frame. Such one-sided coining forms flanges that are coplanar with the top surface of the terminals, but not with the bottom surfaces. As a consequence of coining the peripheral edges from only the bottom side, the area of the top surface of the terminals S, G and D, and consequently, the area available for mounting electronic components on the top surface of these terminals, is maximized. Coining of the peripheral edges in this way results in a broad non-symmetrical "T" cross-section for the terminal S rather than the "+" cross-section of the earlier described embodiment, as seen from the cross-sectional view of FIG. 10.

Turning now to FIG. 8, it can be seen that the embodiment of FIGS. 8-10 also differs from the embodiment of FIGS. 1-7 by the overmolding of the terminals S, G, and D. In other words, unlike the embodiment of FIGS. 1-7, the plastic molding material P covers substantially the entirety of the top surface of the terminals S, G, and D, except for certain specifically predetermined and defined recessed bonding areas 82, 84 and 86. In the preferred embodiment of the invention, the plastic material P has a thickness of approximately 0.004 inches over the top surface of the terminals. The recessed bonding areas 82, 84, and 86,which do not contain the plastic material, provide exposure of, and access to, the terminals S, G, and D. This access to the terminals is necessary for purposes of direct surface mounting and bonding of the electronic component(s) to the top surfaces of the terminals S, G, and D, and for bonding connecting wire from the electronic components to the top surface of the terminals. Such overmolding of the terminals limits exposure of the terminals S, G, and D to only limited recessed bonding areas, significantly reducing the area of the top surfaces of the terminals that is exposed, and reducing the number of possible leak paths from the exterior to the interior of the package 80. This overmolding with plastic material also serves to significantly strengthen the package. Like the embodiment of FIGS. 1-7, plastic material P fills in the space on the bottom side of the terminals S, G, and D created by the coining (beneath the flanges), and forms a surface that is substantially coplanar with the remaining portions of the bottom surfaces of the terminals.

In the specifically illustrated embodiment of FIG. 8-10, the recessed bonding areas 82 and 86 each have a circular configuration of approximately 0.013 inches in diameter and approximately 0.004 inches in depth, and are used for bonding wires 90 and 92 to an electronic component, such as the field effect transistor 94 mounted in the recessed bonding area 84. The recessed bonding area 84 of the preferred embodiment of FIGS. 8-10 has an elongated rectangular configuration with a length of approximately 0.031 inches, a width of approximately 012 inches and a depth of approximately 0.004 inches. The elongated recessed bonding area 84 is used for both mounting an electronic component 94, and for connecting wires 96 and 98 extending from the electronic component to the terminal S. However, as those skilled in the art will readily appreciate, the number and configuration of recessed bonding areas may be selected to accommodate both the electrical requirements of the electronic components (or multiple components) used in the package, and the mechanical requirements imposed by the manufacturing processes used for making the package 80. For example, the requirements of the illustrated field effect transistor 94 can be accommodated by replacing the elongated rectangular recessed bonding area 84 with three separate recessed bonding areas, one for the field effect transistor 94, and one each for each of the two wire connections to the terminal S.

FIGS. 8 and 10 also show contoured plastic reinforcing sections 100, 102, 104 and 106 in the four corners of a component placement area 108 defined by a raised wall 110. These reinforcing sections 100, 102, 104 and 106, which are located above the plastic insulating areas joining the terminals D, S, and G, function to increase the strength and dimensional stability of the package. Cap mating surfaces 112, 114, 116 and 118 are located on the outside of the component placement area 108 to provide surfaces for adhesively bonding a cap, such as the cap 60 depicted in FIG. 7, to the base member 82. The top and bottom surfaces of these cap mating surfaces 112, 114, 116, and 118 are coplanar to the top and bottom surfaces respectively of the terminals D, S, and G.

Like the embodiment of FIGS. 1-7, the embodiment of the package 80 depicted in FIGS. 8-10 has a bottom surface that is substantially coplanar, with substantially the entirety of the bottom surfaces of the terminals D, S and G exposed. This allows surface mounting of the package to a printed circuit board. Thus, the package 80 can be soldered to a printed circuit board at the point directly under the wire bond on the interior of the package. This greatly minimizes the distance between the wire bonds and the printed circuit board. Similarly, the electronic component and terminal locations on the top surface of the package base minimize the length of bonding lead wire between the electronic component and the terminals. Minimizing these distances serves to reduce the inductance and capacitance of the connections, which is particularly advantageous for high frequency applications.

In summary, numerous benefits have been described which result from employing the concepts of the present invention. The cost of the package is greatly reduced in comparison to the cost of ceramic packages of alumina or beryllia, which were used as the insulating materials in prior art transistor packages. The flanges used on the terminals not only prevent accidental removal of the electrical terminals from the package, they allow for the plastic material to be coplanar with the bottom surfaces, and further allow for a planar surface for the completed package, thus facilitating surface mounting of the package on a printed circuit board. Moreover, the flanges, which are preferably located subjacent to the component placement area, increase the length of any potential material interface length path to the component placement area air chamber and prevent or greatly reduce any possibility of unwanted electrical noise. Importantly, while cost is reduced, quality is not forsaken, in that the transistor packages obtained using ceramic insulating material. Obviously, the present invention provides a great advantage over the encapsulation method which achieved economy by forsaking quality.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A package for environmentally sealing an electronic component, comprising:
   a. a base member, said base member including:
      i. a plurality of electrical terminals arranged in fixed predetermined spaced relationship to each other, each of the terminals having a bottom surface having a major portion that is substantially coplanar with major portions of the bottom surfaces of the other of the plurality of terminals, the peripheral edge of selected portions of each of the terminals having a top portion that extends outwardly beyond the extension of the corresponding bottom surface of the terminal; and
      ii. plastic insulating material molded to and encasing each of said terminals, the plastic material covering substantially all of the top surfaces of the terminals except for predetermined recessed areas in which the terminals are exposed, the bottom surface of the plastic material being disposed in the space beneath thee selected portions of the peripheral edges of the terminals and forming a surface that is substantially coplanar with the bottom surfaces of the terminals, the top surface of the plastic material including a raised wall defining a component placement area, the recessed areas being disposed in the component placement area and being adapted for positioning an electronic component on at least one of the terminals and for interconnecting the electronic component with the other terminals; and b. a cap, said cap being seatable upon the top surface of the plastic material to sealingly enclose an air chamber in the component placement area surrounded by the raised wall.

2. A package as recited in claim 1 wherein the peripheral edge of selected portions of each of the terminals are formed by coining the selected portions from the bottom side.

3. A package as recited in claim 1 further including a plurality of contoured plastic reinforcing sections extending from the raised wall to the component placement area.

4. A base as recited in claim 3 wherein each of the terminals have a thickness that is substantially less than either of its length or width.

5. A package as recited in claim 3 wherein at least one of the flanges has an ear that protrudes outwardly into the plastic material for inhibiting withdrawal of the terminal from the molded plastic material.

6. A package as recited in claim 1 wherein the recessed bonding areas have chamfered openings about their peripheries.

7. A package as recited in claim 6 wherein the flanges have a thickness of approximately one third the thickness of the terminals.

8. A package as recited in claim 1 wherein the top portion of the peripheral edge of selected portions of each of the terminals has a thickness approximately equal to one-half the thickness of the terminal.

9. A package as recited in claim 1 wherein the top surfaces of each of the terminals are substantially coplanar.

10. A base as recited in claim 1 wherein the top surfaces of the terminals are substantially coplanar with each other.

11. A package as recited in claim 10 wherein the cap is dimensioned and configured to contact the base member about the top and side portions of the raised rib, and bout the outer periphery of the rib.

12. A base as recited in claim 11 wherein the flanges have a thickness of approximately one third the thickness of the terminals.

13. A package as recited in claim 11 wherein at least one of the flanges has an ear that protrudes outwardly into the plastic material for inhibiting withdrawal of the terminal from the molded plastic material.

14. A package as recited in claim 1 wherein the plastic material is polyphenylene sulfide.

15. A package as recited in claim 14 wherein the adhesive is a two-part epoxy adhesive consisting of approximately twelve parts by weight of an epoxy polymer to eight parts by weight of mica to five parts by weight of an anhydride.

16. A package as recited in claim 1 wherein the flanges are formed by coining selected peripheral areas of the terminals.

17. A package as recited in claim 1 wherein the cap is dimensioned and configured to contact the base member at selected contacting seating surfaces, and the contacting seating surfaces of the base member and the cap are roughened to increase the area of the contacting surfaces.

18. A package as recited in claim 1 wherein the cap is secured to the base member with an adhesive.

19. A base as recited in claim 18 wherein top surfaces of the terminals are substantially coplanar with each other.

20. A base as recited in claim 18 wherein the plastic material is polyphenylene sulfide.

21. A package as recited in claim 1 wherein the component placement area defined by the raised ribs has a square configuration.

22. A package as recited in claim 1 wherein the base member includes at least three terminals.

23. A package for environmentally sealing an electronic component, comprising:
  a. a base member, said base member including:
    i. a plurality of electrical terminals arranged in fixed predetermined spaced relationship to each other, each of the terminals having a bottom surface that is substantially coplanar with the bottom surfaces of the other of the plurality of terminals, at least one of said terminals having a flange on a portion of its periphery extending between planes formed by said bottom surface and a top surface of said terminal, the flange having a thickness that is substantially less than the thickness of the remaining portions of the terminal; and
    ii. plastic insulating material molded to each of said terminals and encasing said flange, the bottom surface of the plastic material being coplanar with the bottom surfaces of the terminals, the top surface of the plastic material including a raised rib defining a component placement area having surface exposure to a plurality of the terminals for positioning an electronic component, the flange being positioned subjacent to the component placement area, whereby the bottom surface of the base member is substantially coplanar and adapted for surface mounting to a circuit board; and
  b. a cap, said cap being seated upon the top surface of the plastic material to sealingly enclose an air chamber in the component placement area surrounded by the raised rib.

24. A package for environmentally sealing an electronic component, comprising:
  a. a base member, said base member including:
    i. a plurality of electrical terminals arranged in fixed predetermined spaced relationship to each other, each of the terminals having substantially planar top and bottom surfaces that are coplanar with the respective top and bottom surfaces of the other of the plurality of terminals, each of said terminals having a thickness that is substantially less than either its length or width and a flange on a portion of its periphery extending between planes formed by said top and bottom surfaces, the flanges having a thickness that is substantially less than the remaining portions of the terminals; and
    ii. plastic insulating material molded to each of said terminals and encasing said flanges, the bottom surface of the plastic material being coplanar with the bottom surfaces of the terminals, the top surface of the plastic material including a raised rib defining a component placement area for positioning an electronic component, whereby the bottom surface of the base is substantially coplanar and adapted for surface mounting to a circuit board; and b. a cap, the lower surface of said cap having a configuration that is complimentary to the configuration of the top surface of the base member, said cap being seated upon the top surface of the base member to sealingly enclose an air chamber in the component placement area defined by the raised rib.

25. A base member adapted for sealing engagement with a cap for environmentally packaging an electronic component, comprising:
   a. a plurality of electrical terminals arranged in fixed predetermined spaced relationship to each other, the terminals having substantially planar bottom surfaces that are coplanar with each other, each of said terminals having a flange on a portion of its periphery, extending between planes formed by said bottom surfaces and top surfaces of said terminals, the flanges having a thickness that is substantially less than the remaining portions of the terminals; and
   b. plastic insulating material molded to each of said terminals and encasing said flanges, the top surface of the plastic material defining a component placement area for positioning an electronic component and further including a raised rib, said raised rib surrounding the component placement area, the bottom surface of the plastic material being coplanar with the bottom surfaces of the terminals whereby the bottom surface of the base is substantially coplanar and adapted for surface mounting to a circuit board.

26. A package for environmentally sealing one or more electronic components, comprising:
   a. a base member, said base member including:
      i. a plurality of electrical terminals arranged in fixed predetermined spaced relationship to each other, each of the terminals having top and bottom surfaces with major portions that are substantially coplanar with major portions of the respective top and bottom surfaces of the other of the plurality of terminals, the peripheral edge of at least one of the terminals having an outwardly extending portion that is in the space defined by the planes of the major portions of the top and bottom surfaces, the flange having a thickness that is substantially less than the remaining portions of the terminal; and
      ii. plastic insulating material molded to and encasing said flange, the bottom surface of the plastic material being coplanar with the bottom surface of said terminal, and including a raised rib defining a component placement area having surface exposure to a plurality of the terminals for positioning an electronic component, whereby the bottom surface of the base member is substantially coplanar and adapted for surface mounting to a circuit board; and
   b. a cap, said cap seated upon the top surface of the plastic material to sealingly enclose an air chamber in the component placement area surrounded by the raised rib.

27. A package as recited in the claim 26 wherein the flange is positioned proximal to the component placement area.

28. A package for environmentally sealing one or more electronic components, comprising:
   a. a base member, said base member including:
      i. a plurality of electrical terminals arranged in fixed predetermined spaced relationship to each other, each of the terminals having a bottom surface with a major portion that is substantially coplanar with a major portion of the bottom surfaces of the other of the plurality of terminals, at least one of the terminals having a flange on a portion of its periphery that extends outwardly in a direction generally parallel to the plane of the bottom surfaces of the terminals, the flange having a thickness that is substantially less than the remaining portions of the terminal; and
      ii. plastic insulating material molded to and encasing said flange, the bottom surface of the plastic material being coplanar with the bottom surfaces of the terminals, the top surface of the plastic material including a raised rib defining a component placement area having surface exposure to a plurality of the terminals for positioning one or more electronic components, whereby the bottom surface of the base member is substantially coplanar and adapted for surface mounting to a circuit board; and
   b. a cap, said cap seated upon the top surface of the plastic material to sealingly enclose an air chamber in the component placement area surrounded by the raised rib.

* * * * *